US009897975B2

(12) United States Patent
Salle et al.

(10) Patent No.: US 9,897,975 B2
(45) Date of Patent: Feb. 20, 2018

(54) CALIBRATION METHOD AND APPARATUS FOR HIGH TDC RESOLUTION

(71) Applicant: NXP USA, INC., Austin, TX (US)

(72) Inventors: Didier Salle, Toulouse (FR); Olivier Doare, La Salvetat St Gilles (FR); Cristian Pavao Moreira, Frouzins (FR); Birama Goumballa, Larra (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/477,237

(22) Filed: Apr. 3, 2017

(65) Prior Publication Data
US 2017/0293265 A1 Oct. 12, 2017

(30) Foreign Application Priority Data

Apr. 11, 2016 (EP) .................................. 16290067

(51) Int. Cl.
*H03M 1/10* (2006.01)
*G04F 10/00* (2006.01)
(52) U.S. Cl.
CPC ........ *G04F 10/005* (2013.01); *H03M 1/1009* (2013.01)
(58) Field of Classification Search
CPC ........................... H03M 1/1009; G04F 10/005
USPC .................................................. 341/12–155
See application file for complete search history.

(56) References Cited

U.S. PATENT DOCUMENTS

| 6,058,057 | A | 5/2000 | Ochiai et al. |
| 6,101,197 | A * | 8/2000 | Keeth ....................... G06F 1/10 370/503 |
| 8,570,082 | B1 | 10/2013 | Kuo et al. |
| 2007/0063752 | A1 | 3/2007 | Kowalczyk et al. |
| 2008/0069292 | A1* | 3/2008 | Straayer ............... G04F 10/005 377/46 |
| 2008/0129574 | A1 | 6/2008 | Choi et al. |
| 2008/0157839 | A1* | 7/2008 | Staszewski ............. H03L 7/091 327/161 |
| 2010/0283653 | A1* | 11/2010 | Dai ....................... G04F 10/005 341/166 |
| 2012/0112841 | A1 | 5/2012 | Hayashi |
| 2012/0230158 | A1 | 9/2012 | Chuang et al. |
| 2016/0056827 | A1* | 2/2016 | Vlachogiannakis . H03B 5/1265 327/158 |

* cited by examiner

*Primary Examiner* — Lam T Mai

(57) ABSTRACT

Various embodiments include a time to digital converter device comprising: a medium resolution delay unit including a plurality of buffers, the medium resolution delay unit configured to receive as inputs a reference clock signal and a data clock signal and configured to output a plurality of delayed data clock signals wherein the delay between the plurality of delayed data clock signal is a medium resolution delay value; a fine resolution delay unit including a plurality of cores configured to receive as inputs the reference clock signal and the plurality of delayed data clock signals from the medium resolution delay unit, wherein the plurality of cores includes: a first bank of delays configured to receive one of the plurality of the delayed data clock signals, a second bank of delays configured to receive the reference clock signal, and; and a fast flip flop connected to the outputs of the first bank of delays and the second bank of delays, wherein the output of the fast flip flop is used to check the phase alignment.

20 Claims, 7 Drawing Sheets

CALIBRATION METHOD AND APPARATUS FOR HIGH TDC RESOLUTION

CROSS-REFERENCE TO RELATED APPLICATIONS

This application claims the priority under 35 U.S.C. § 119 of European Patent application no. 16290067.4, filed on 11 Apr. 2016, the contents of which are incorporated by reference herein.

TECHNICAL FIELD

Various embodiments disclosed herein relate generally to circuit timing.

BACKGROUND

All Digital Phase Locked Loops (ADPLL) may be employed as frequency synthesizers in Radio Frequency (RF) circuits to create stable local oscillators for transmitters or receivers. This is due to the low power consumption and high integration levels of ADPLL's.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of a preferred embodiment adequate to allow those of ordinary skill in the art to make and use the inventive concepts will follow in later sections.

Various embodiments described herein relate to a time to digital converter device including: a medium resolution delay unit including a plurality of buffers, the medium resolution delay unit configured to receive as inputs a reference clock signal and a data clock signal and configured to output a plurality of delayed data clock signals wherein the delay between the plurality of delayed data clock signal is a medium resolution delay value; a fine resolution delay unit including a plurality of cores configured to receive as inputs the reference clock signal and the plurality of delayed data clock signals from the medium resolution delay unit, wherein the plurality of cores includes: a first bank of delays configured to receive one of the plurality of the delayed data clock signals, a second bank of delays configured to receive the reference clock signal, and; a fast flip flop connected to the outputs of the first bank of delays and the second bank of delays, wherein the output of the fast flip flop indicates a fine resolution delay value. The first bank of delays and the second bank of delays may include a plurality of capacitors in series. A first portion of the plurality of capacitors may be used for calibration. A second portion of the plurality of capacitors may be used for normal operation. Each core of the plurality of cores may include two multiplexers. The plurality of cores may be configured to receive a control signal that places the cores into a calibration mode. Each of the plurality of cores may be configured to receive a control signal that calibrates the core.

Various embodiments described herein relate to a method of calibrating a time to digital conversion including a medium resolution delay unit and fine resolution delay unit including a first delay bank and a second delay bank, the method comprising: initializing a calibration delay value; applying the calibration delay value to a first delay bank; inputting a clock signal to the first delay bank and second delay bank; and inputting outputs of the first delay bank and the second delay bank to a fast flip flop; and when the fast flip flop indicates that the outputs of the first delay bank and the second delay bank are not aligned, incrementing the calibration delay value and reapplying the incremented calibration delay value to the first delay bank.

The method may further comprise when the fast flip flop indicates that the outputs of the first delay bank and the second delay bank are aligned, setting the calibration delay value. The first bank of delays and the second bank of delays may include a plurality of capacitors in series. A first portion of the plurality of capacitors may be used for calibration. A calibration delay value may indicate which of the first portion of the plurality of capacitors to connect in parallel to achieve the desired calibration delay value. The method may further comprise setting a first multiplexer and a second multiplexer to input the clock signal into the first delay bank and the second delay bank when in a calibration mode.

Various embodiments described herein relate to a non-transitory machine-readable storage medium encoded with instructions for performing a method of calibrating a time to digital conversion including a medium resolution delay unit and fine resolution delay unit including a first delay bank and a second delay bank, the medium comprising: instructions for initializing a calibration delay value; instructions for applying the calibration delay value to a first delay bank; instructions for inputting a clock signal to the first delay bank and second delay bank; and instructions for inputting outputs of the first delay bank and the second delay bank to a fast flip flop; and when the fast flip flop indicates that the outputs of the first delay bank and the second delay bank are not aligned, incrementing the calibration delay value and reapplying the incremented calibration delay value to the first delay bank.

The non-transitory machine-readable storage medium may further comprise when the fast flip flop indicates that the outputs of the first delay bank and the second delay bank are aligned, setting the calibration delay value. The first bank of delays and the second bank of delays may include a plurality of capacitors in series. A first portion of the plurality of capacitors may be used for calibration. A calibration delay value may indicate which of the first portion of the plurality of capacitors to connect in parallel to achieve the desired calibration delay value.

Various embodiments described herein relate to a method of calibrating a time to digital converter (TDC), the method comprising: changing the TDC from a power off state to a power on state by enabling an XTAL reference signal and a digitally controlled Oscillator (DCO) signal and switching a reset signal to off; from the power on state, enabling fine calibration with an enable calibration signal; and calibrating on a fine resolution delay unit including a core which received inputs from a medium resolution delay unit, wherein the core includes a bank of delays each one adding 2.5 picoseconds delay and a multiplexer configured to use the same signal on the two paths (either the reference or the DCO signal) and a control signal from an accurate fast flip flop to determine the phase alignment.

BRIEF DESCRIPTION OF THE DRAWINGS

In order to better understand various embodiments, reference is made to the accompanying drawings, wherein.

To facilitate understanding, identical reference numerals have been used to designate elements having substantially the same or similar structure or substantially the same or similar function.

DETAILED DESCRIPTION

Figure 1:
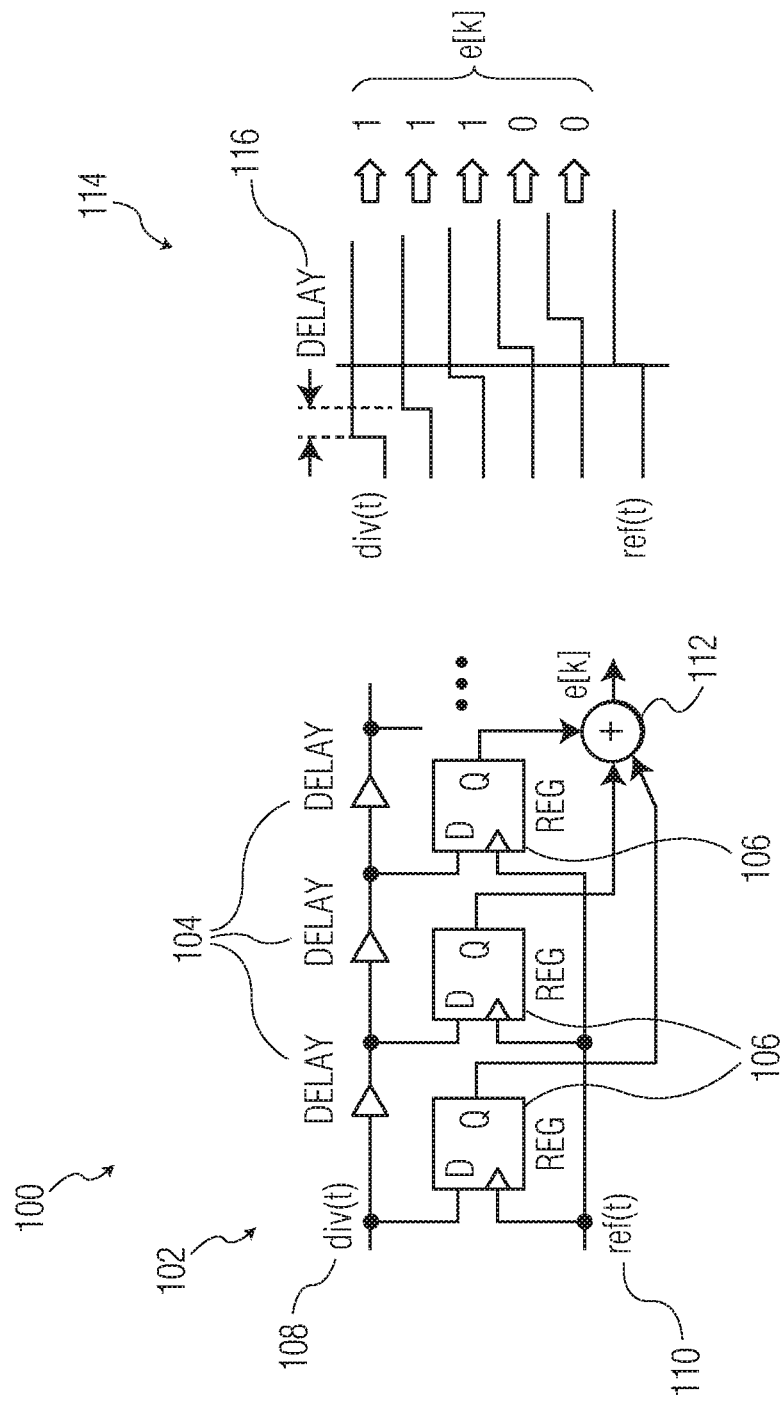
FIG. 1 illustrates an embodiment of a TDC and its timing diagram.

The description and drawings presented herein illustrate various principles. It will be appreciated that those skilled in the art will be able to devise various arrangements that, although not explicitly described or shown herein, embody these principles and are included within the scope of this disclosure. As used herein, the term, "or" refers to a non-exclusive or (i.e., and/or), unless otherwise indicated (e.g., "or else" or "or in the alternative"). Additionally, the various embodiments described herein are not necessarily mutually exclusive and may be combined to produce additional embodiments that incorporate the principles described herein.

Phase Locked Loops (PLL's) may be circuits including voltage or current driven oscillators and a phase detector. The oscillator may be constantly adjusted to match the phase of the frequency of the input signal. PLL's may be used to stabilize channels of communication, generate signals, create clocks, modulate/demodulate signals or reconstitute signals with less noise. PLL's may be used for digital as well as analog communications and systems.

PLL's may include one or more Voltage Controlled Oscillators (VCO) which may be initially tuned to a frequency near the intended transmitting/receiving frequency. The VCO's frequency of oscillation may controlled by the input voltage. VCO's may be either linear or relaxation oscillators. Linear oscillators may generate more sinusoidal waves while relaxation oscillators may generate more triangular or sawtooth waves.

A PLL may similarly include a Phase Frequency Detector (PFD) which may compare the phases of two input signals. For example, the PFD may compare a signal from the VCO to another source or data signal. The PFD may supply an error output which may be fed back into the loop filter. The error output may integrate with the signal in the feedback of the loop to compensate for the correction of the offset of the signal. A PFD may similarly allow for a frequency error output and compensation.

Another type of PLL may be an All Digital PLL (ADPLL), mentioned above, where the phase detector, filter and oscillator may all be digital. For example, in an ADPLL, a Time to Digital Converter (TDC) may serve as the PFD while a Digitally Controlled Oscillator may replace the VCO.

The TDC may be a digital circuit that receives an input signal and a reference signal, detects the phase difference between the two signals, and provides a digital value of the detected phase difference. The phase difference between the two signals may be given by the time difference between the leading edge of the input signal and the leading edge of the reference signal. The TDC typically may include a set of inverters coupled in series and used to determine the phase difference between the two signals. The TDC digitizes this phase difference and provides the digitized phase difference. The resolution of the TDC, which is the quantization step size for the digitized phase difference, is typically determined by the delay of one inverter in the set of inverters.

The TDC may be used in an ADPLL or some other circuit. It may be desirable to obtain fine resolution for the TDC in order to improve the performance of the ADPLL or some other circuit in which the TDC is used.

Embodiments include the TDC which affects the performance of the whole ADPLL as it may set the in-band noise and the TDC may be responsible for the presence of spurious tone at the PLL output. The TDC may measure and digitize the phase difference between reference signal and feedback signal, therefore the TDC may induce quantization errors when converting time to digital word due to finite resolution which affects performance at the system level.

A high resolution TDC may be selected to meet stringent phase noise such as in radar applications. Sub-gate resolution TDC may be used in such an application. Some embodiments include an architecture which requires very accurate phase alignment. A delay calibration method may be used to minimize misalignment due to routing and components mismatch. Embodiments may also include a calibration method which may be implemented in a Medium-Fine based TDC topology.

FIG. 1 illustrates an embodiment of a TDC and its timing diagram 100. TDC embodiment 102 may include delay inverters 104, D flip-flops 106, signal clock 108, reference clock 110 and adder 112. Timing diagram 114 may include a delay such as delay 116 which includes an offset between signal clock 108 and reference clock 110.

The delay inverters 104 may have two categories of delay. A first delay category may include a gate delay including buffers or inverters. Similarly, a second delay category may include a sub-gate delay. Sub-gate delays may include delay differencing and delay line capacitors. Examples of the second delay category may include Vernier or Flash Medium Fine.

Figure 2:
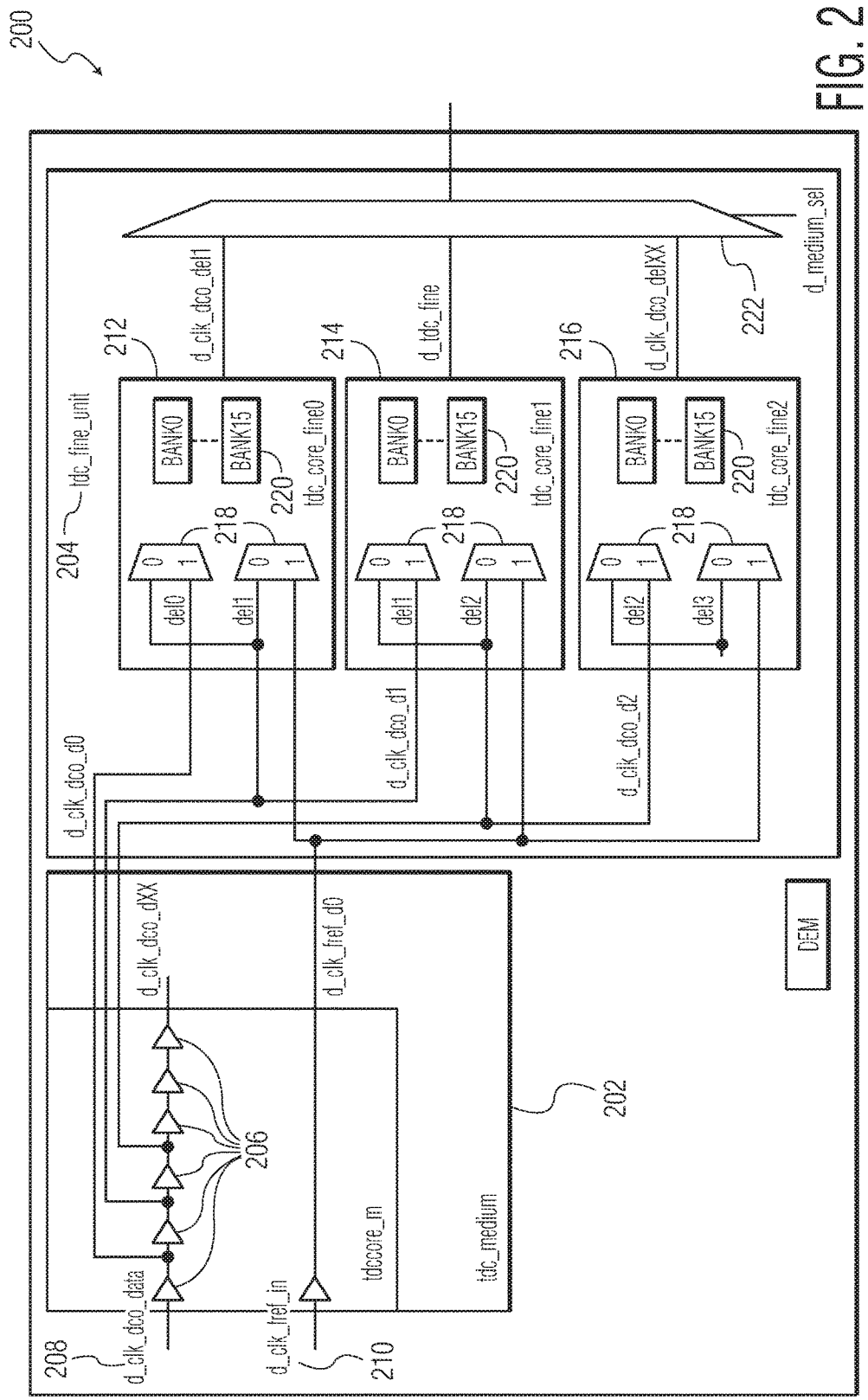
FIG. 2 illustrates an embodiment of TDC architecture.

FIG. 2 illustrates an embodiment of TDC architecture 200. TDC architecture 200 may include medium resolution delay unit 202 and fine resolution delay unit 204. Medium resolution delay unit 202 may include delay buffers 206, input data clock 208, and input reference clock 210. Clock signals from medium resolution delay unit 202 may be used as inputs to fine resolution delay unit 204.

Fine resolution delay unit 204 may include cores 212-216 and decoder 222. Cores 212-216 may each include one or more multiplexers such as core multiplexers 218. Each core 212-216 may include a delay bank such as delay bank 220 which is described further with respect to FIGS. 3-4. Decoder 222 may take as input the output from the medium resolution unit and select one of the data signals to be output as a clock. Decoder 222 may receive a signal such as d_medium_sel or a control select from a control module or circuit on or off the same circuit board that selects which of the inputs to the decoder 222 will be output to synchronize sub blocks in the digital part of the ADPLL.

Delay buffers 206 in medium resolution delay unit 202 may each include, for example, a 40 picosecond buffer. During calibration, the medium resolution delay may specify a 40 picosecond time period and then fine resolution delay unit may calibrate more exactly within that 40 picosecond time period. Each buffer from delay buffers 206 may be input into one or more of cores 212-216 and core multiplexers 218. Core multiplexers 218 may each select between one of the delay signals coming in. During calibration, the core multiplexers 218 are set to feed the same signal into the delay bank 220. This results in determining the time delay difference in the cores 212-216 due to component and other differences that can be calibrated out. During normal operation, the core multiplexers 218 are set to feed an output from the medium resolution delay unit 202 and the reference signal 210 are input into the delay bank 220. This results in a finer determination of the time difference between the input data clock 208 and the input reference clock 210.

Fine resolution delay unit 204 may thereafter use a finer resolution to calibrate and/or to output a data signal. For example, fine resolution delay unit 204 may be calibrated to a 2.5 picosecond level whereas medium resolution specifies a 40 picosecond level.

Figure 3:
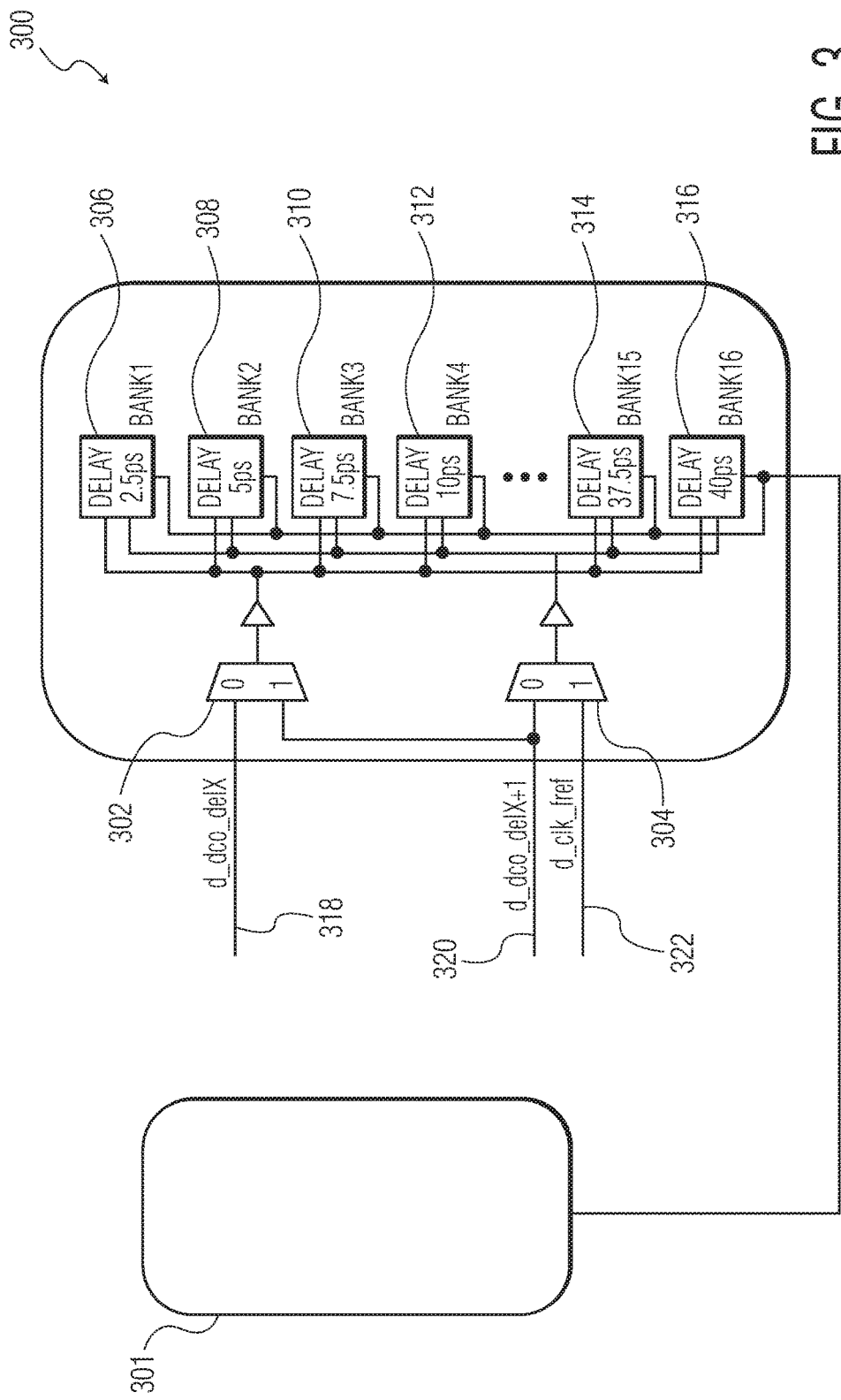
FIG. 3 illustrates an embodiment of TDC fine resolution core.

FIG. 3 illustrates an embodiment of a TDC fine resolution core 300. TDC fine resolution core 300 may include controller 301, multiplexers 302-304, delays 306-316, data DCO delay signal X 318, data DCO delay signal X+1 320, and clock reference signal 322. In some embodiments each of delays 306-316 may cause incrementally an additional 2.5 picosecond delay. For example, if 16 delays are turned on, then a total of a 40 picosecond delay may be spanned by the TDC fine resolution delay core 300. Similarly, any number of the delays may be activated, each adding an incremental amount of time to offset the signal. A 2.5 picosecond incremental delay is used as an example and any amount of time may be used per delay, for example, 1, 1.5 or 6 picoseconds. Control 301 may output a control signal into delays 306-316 to select the appropriate number of delays to use.

Figure 4:
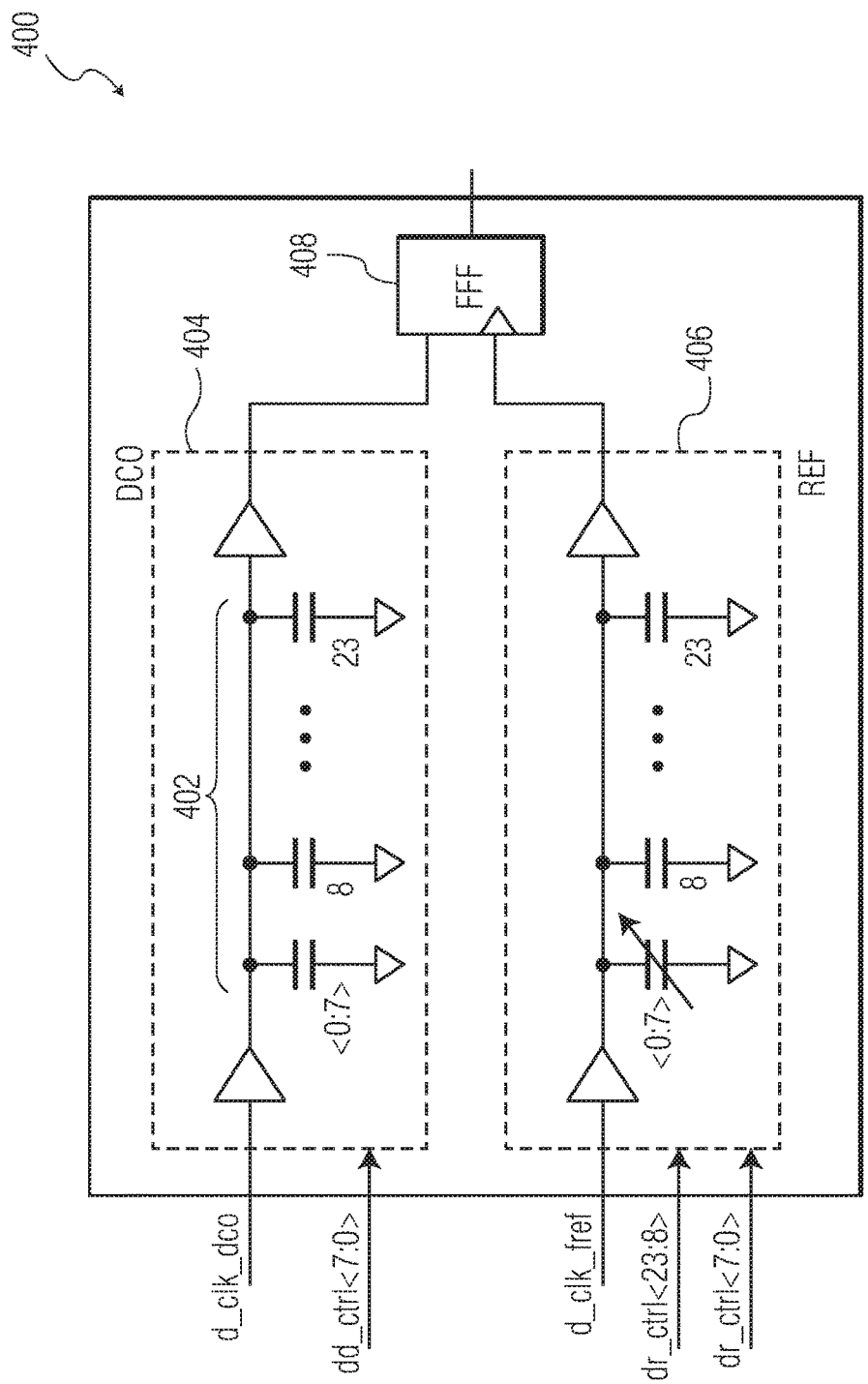
FIG. 4 illustrates an delay

FIG. 4 illustrates an delay 400. Delay 400 may correspond to delays 306-316. Delay 400 may include a DCO signal delay bank 404, reference signal delay bank 406, and fast flip flop 408. DCO signal delay bank 404 may include capacitor bank 402. Capacitor bank 402 may include, for example 24 capacitors. The first capacitors may be used for calibration in some embodiments. In other embodiments, the last or miscellaneous capacitors may be used for normal operation. For example, the first eight or most significant bit (MSB) capacitors may be used specifically for calibration. In this case, the remaining 16 capacitors or least significant bits (LSB) may be used for normal operation. Reference signal delay bank 406 may function similarly to DCO signal delay bank 404 with the clock reference signal as input rather than the data line.

A control signal may be input to delay 400 from control 301. The control signal may be used in dd_ctrl<7:0>, dr_ctrl<23:8>, and dr_ctrl<7:0> signals displayed. The control signal may have any number of bits of resolution such as 8, 12, 16, 20, 24 or more, for example. An 8 bit control signal is displayed for example. The dd_ctrl<7:0> controlling signals are used in the dco path and the dr_ctrl<7:0> controlling signals are used in the reference path to calibrate the misalignment generated by mismatch and routing path in the circuit. A default setting for example dd_ctrl<7:0>=4 is defined to guarantee an alignment during the calibration (the reference signal could be early or late). The output of DCO signal delay bank 404 and Reference signal delay bank 406 may be input into fast flip flop 408. Fast flip flop 408 may be any kind of flip flop including a fast flip flop. Fast flip flop 408 may take the data signal clock and the reference signal clock as input and output a 0 when the clocks are not calibrated.

The output of fast flip flop 408 may be looped back into the controller during calibration in order to vary the calibration values to determine the calibration value that gives zero delay which correspond to a transition from 0 to 1 at the fast flip flop output. For example, the DCO delay signal X 318 and clock reference signal 322 may be off by 5 picoseconds. This may be compensated for during calibration by looping the signal back into the fine resolution calibration according to the amount of time that the signal is off. Once the data signal clock and the reference clock are the same, the output of the fast flip flop may switch from 0 to 1 and the signals are aligned.

The fast flip flop 408 may be any kind of flip flop that is fast enough to provide the specified time resolution. In this embodiment, the fast flip flop may switch at 1 ps which supports the 2.5 ps resolution of the delay 400.

The output time resolution may be determined by the application for which the ADPLL is used. For example, ADPLL may be used for a wireless communication device, and the frequency of oscillation may be hundreds of megahertz (MHz) or a few gigahertz (GHz). The master clock may be generated based on a crystal oscillator (XCO), a voltage controlled crystal oscillator (VCXCO), a temperature compensated crystal oscillator (TCXCO), or some other type of oscillator having an accurate frequency.

Figure 5:
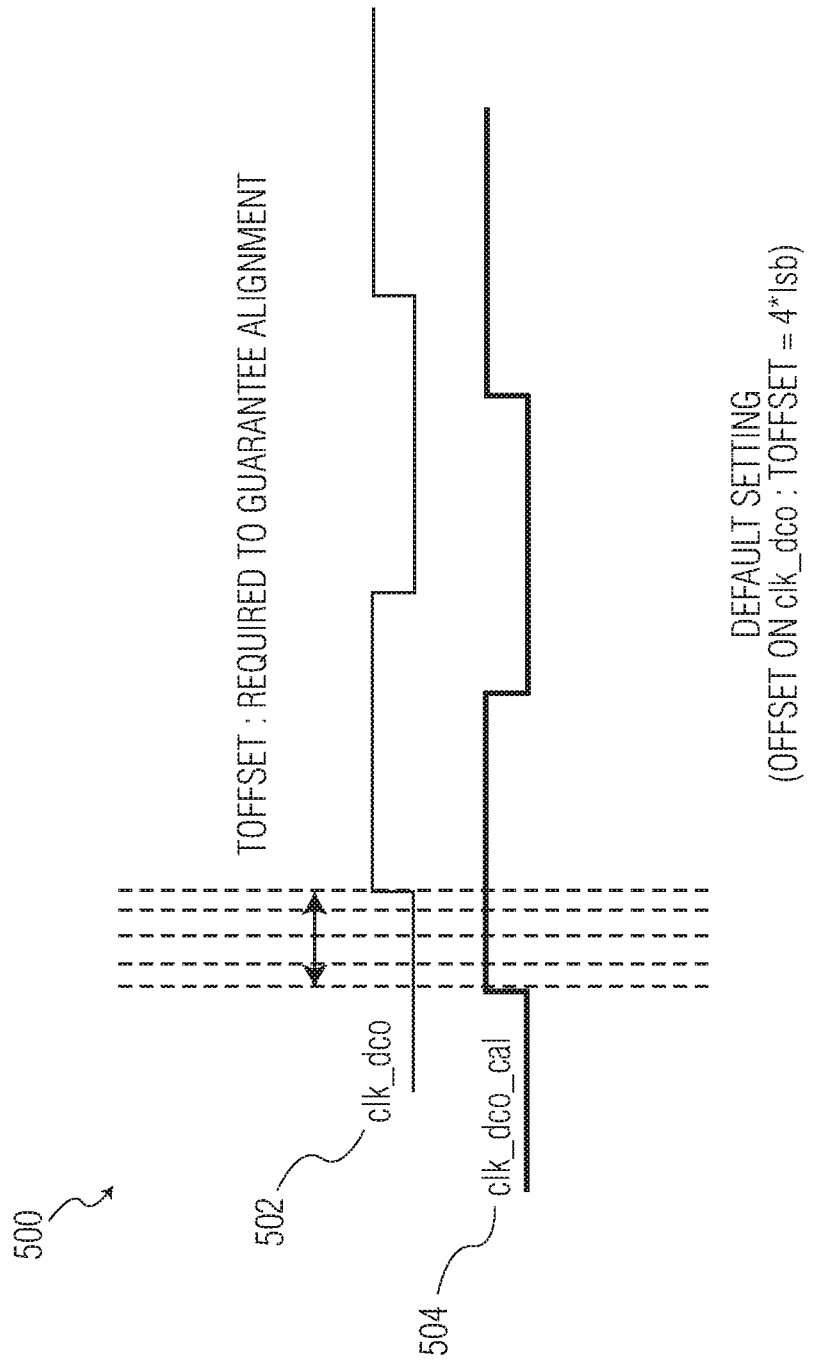
FIG. 5 illustrates a configuration timing diagram.

FIG. 5 illustrates a configuration timing diagram 500. Timing diagram 500 includes DCO clock 502 and DCO calibration clock 504. DCO clock may be offset in time by 4 time periods as pictured. In this case, the 4 LSB's may be turned on to configure the DCO signal.

Figure 6:
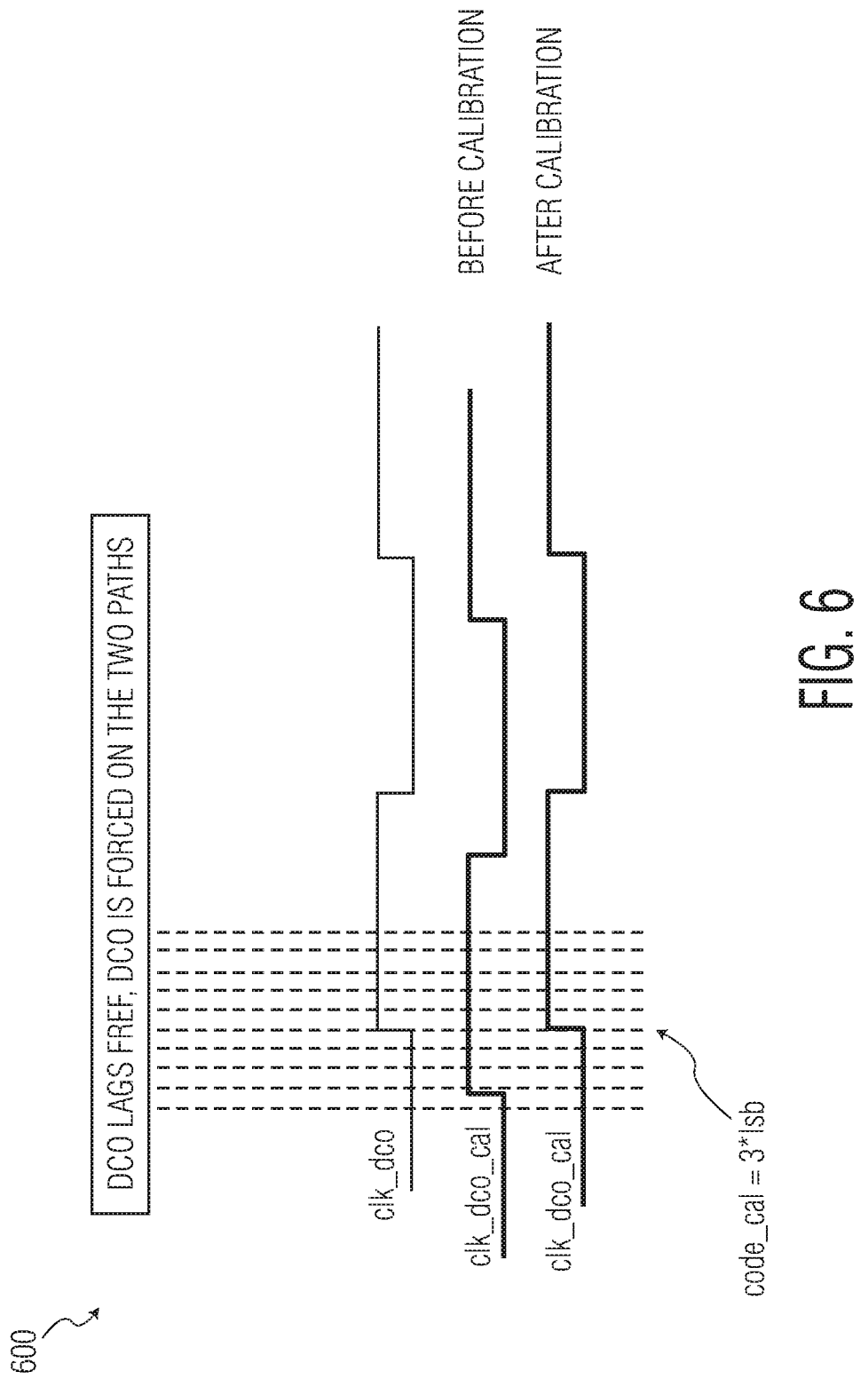
FIG. 6 illustrates a correction timing diagram.

FIG. 6 illustrates a correction timing diagram 600. Correction timing diagram 600 illustrates a DCO signal before and after calibration. The DCO signal lags the reference frequency in this case, and 3 bits of correction are provided. The corrective bits may include one capacitor each, for example, at 2.5 picoseconds.

Figure 7:
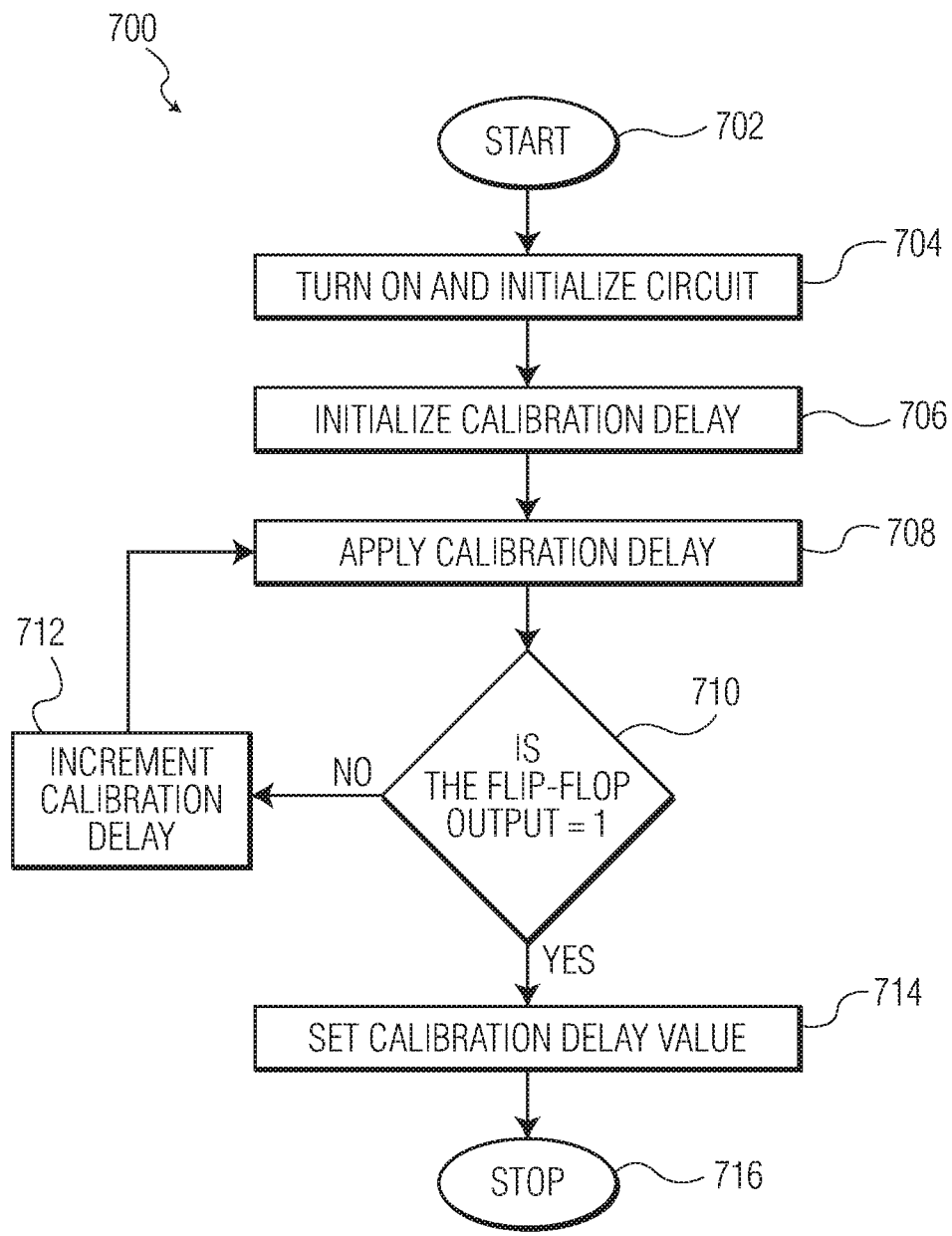
FIG. 7 illustrates a calibration method.

FIG. 7 illustrates a calibration method 700. The calibration method 700 begins at step 702 and proceeds to step 704. At step 704, the circuit is turned on and initialized. Next, the calibration method 700 initializes the calibration delay 706. This value may be initialized to a default setting for example 4 LSB. As part of this, the multiplexers 302-304 are set to feed the same signal into the DCO signal delay bank 404 and the reference signal delay bank 406. Next, the calibration method 700 applies the calibration delay value 708 to the reference signal delay bank 406. Then the method 700 determines if the output of the fast flip flop 408 is equal to 1. This indicates that the outputs for the DCO signal delay bank 404 and the reference signal delay back 406 are aligned. If not, the calibration delay value is incremented 712. Then the incremented calibration delay value is applied again to reference signal delay bank 406 and the process repeats 708. If the output of the flip flop is 1, then the method sets the calibration delay value 714 for the delay 400. The method then ends at step 716. It is noted that this calibration method may be carried out for each of the delays in each of the cores so that all of the various portions of the fine resolution delay unit 204 are calibrated.

Also in step 710, the method 700 may check to see if the calibration delay value has exceeded a maximum value without the fast flip flop 408 producing a value of 1. In this case there may be an error and the system may be restarted or an error indication is produced indicating a calibration failure. The default setting could be adjusted to restart the calibration algorithm for 5 or 6 LSB rather than 4 LSB.

The TDCs and ADPLLs described herein may be used for various applications such as communication, computing, networking, personal electronics, etc. For example, the TDCs and ADPLLs may be used for wireless communication devices, cellular phones, handheld devices, gaming devices, laptop computers, consumer electronics devices, personal computers, etc.

The TDCs and ADPLLs described may be used for frequency synthesis in receivers and/or transmitters which may operate over a wide range of frequencies. The TDC and ADPLL described herein may be implemented on an Integrated Circuit (IC), an analog IC, an RF IC (RFIC), a mixed-signal IC, an application specific integrated circuit (ASIC), a printed circuit board (PCB), an electronics device, etc. The TDCs and ADPLLs may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc. The TDCs and ADPLLs may be implemented with deep sub-micron RFCMOS transistors and may be able to achieve good performance and a high level of integration.

It should be apparent from the foregoing description that various embodiments of the invention may be implemented in hardware. Furthermore, various embodiments may be implemented as instructions stored on a non-transitory machine-readable storage medium, such as a volatile or non-volatile memory, which may be read and executed by at least one processor to perform the operations described in detail herein. A machine-readable storage medium may include any mechanism for storing information in a form readable by a machine, such as a personal or laptop computer, a server, or other computing device. Thus, a non-transitory machine-readable storage medium excludes transitory signals but may include both volatile and non-volatile memories, including but not limited to read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various embodiments have been described in detail with particular reference to certain aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

The invention claimed is:

1. A time to digital converter device comprising:
a medium resolution delay unit including a plurality of buffers, the medium resolution delay unit configured to receive as inputs a reference clock signal and a data clock signal and configured to output a plurality of delayed data clock signals wherein the delay between the plurality of delayed data clock signal is a medium resolution delay value;
a fine resolution delay unit including a plurality of cores configured to receive as inputs the reference clock signal and the plurality of delayed data clock signals from the medium resolution delay unit,
wherein the plurality of cores includes:
a first bank of delays configured to receive one of the plurality of the delayed data clock signals,
a second bank of delays configured to receive the reference clock signal, and;
a fast flip flop connected to the outputs of the first bank of delays and the second bank of delays, wherein the output of the fast flip flop indicates a fine resolution delay value.

2. The device of claim 1 wherein the first bank of delays and the second bank of delays include a plurality of capacitors in series.

3. The device of claim 2, wherein a first portion of the plurality of capacitors are used for calibration.

4. The device of claim 3, wherein a second portion of the plurality of capacitors are used for normal operation.

5. The device of claim 1, wherein each core of the plurality of cores includes two multiplexers.

6. The device of claim 1, wherein the plurality of cores is configured to receive a control signal that places the cores into a calibration mode.

7. The device of claim 1, wherein each of the plurality of cores is configured to receive a control signal that calibrates the core.

8. A method of calibrating a time to digital conversion including a medium resolution delay unit and fine resolution delay unit including a first delay bank and a second delay bank, the method comprising:
initializing a calibration delay value;
applying the calibration delay value to a first delay bank;
inputting a clock signal to the first delay bank and second delay bank; and
inputting outputs of the first delay bank and the second delay bank to a fast flip flop; and
when the fast flip flop indicates that the outputs of the first delay bank and the second delay bank are not aligned, incrementing the calibration delay value and reapplying the incremented calibration delay value to the first delay bank.

9. The method of claim 8, further comprising when the fast flip flop indicates that the outputs of the first delay bank and the second delay bank are aligned, setting the calibration delay value.

10. The method of claim 8, wherein the first bank of delays and the second bank of delays include a plurality of capacitors in series.

11. The method of claim 10, wherein a first portion of the plurality of capacitors are used for calibration.

12. The method of claim 11, wherein calibration delay value indicates which of the first portion of the plurality of capacitors to connect in parallel to achieve the desired calibration delay value.

13. The method of claim 8 further comprising setting a first multiplexer and a second multiplexer to input the clock signal into the first delay bank and the second delay bank when in a calibration mode.

14. A non-transitory machine-readable storage medium encoded with instructions for performing a method of calibrating a time to digital conversion including a medium resolution delay unit and fine resolution delay unit including a first delay bank and a second delay bank, the medium comprising:
instructions for initializing a calibration delay value;
instructions for applying the calibration delay value to a first delay bank;
instructions for inputting a clock signal to the first delay bank and second delay bank; and instructions for inputting outputs of the first delay bank and the second delay bank to a fast flip flop; and when the fast flip flop indicates that the outputs of the first delay bank and the second delay bank are not aligned, incrementing the calibration delay value and reapplying the incremented calibration delay value to the first delay bank.

15. The non-transitory machine-readable storage medium of claim 14, further comprising when the fast flip flop indicates that the outputs of the first delay bank and the second delay bank are aligned, setting the calibration delay value.

16. The device of claim 2, wherein each core of the plurality of cores includes two multiplexers.

17. The device of claim 2, wherein the plurality of cores is configured to receive a control signal that places the cores into a calibration mode.

18. The device of claim 2, wherein each of the plurality of cores is configured to receive a control signal that calibrates the core.

19. The method of claim 10, further comprising when the fast flip flop indicates that the outputs of the first delay bank and the second delay bank are aligned, setting the calibration delay value.

20. The method of claim 10 further comprising setting a first multiplexer and a second multiplexer to input the clock signal into the first delay bank and the second delay bank when in a calibration mode.

* * * * *